United States Patent [19]  
Schultheiss et al.

[11] Patent Number: 5,028,584  
[45] Date of Patent: Jul. 2, 1991

[54] PROCESS AND APPARATUS FOR PRODUCING EPITAXIAL AND/OR HIGHLY TEXTURED GROWN FILM, FREE OF FOREIGN PHASES, OF A HIGH-$T_c$-OXIDE SUPERCONDUCTOR ON A SUBSTRATE

[75] Inventors: Christoph Schultheiss, Karlsruhe; Jochen Geerk, Stutensee; Hans Karow, Karlsruhe, all of Fed. Rep. of Germany

[73] Assignee: Kernforschungszentrum Karlsrube GmbH, Fed. Rep. of Germany

[21] Appl. No.: 407,989

[22] Filed: Sep. 15, 1989

[30] Foreign Application Priority Data

Oct. 10, 1988 [DE] Fed. Rep. of Germany ....... 3834402

[51] Int. Cl.$^5$ .......................... B05D 3/06; B05D 5/12
[52] U.S. Cl. ...................................... 505/1; 118/724; 427/35; 505/732
[58] Field of Search ................... 204/192.11, 298 BD, 204/192.24, 298.02, 298.04; 427/35, 37, 38; 118/724, 725, 726; 505/730, 732, 1, 731

[56] References Cited

U.S. PATENT DOCUMENTS 4,863,581 9/1989 Inokuti et al. ................ 118/7276 X
4,874,741 10/1989 Shaw et al. .................... 427/53.1 X

FOREIGN PATENT DOCUMENTS 2804393 2/1987 Fed. Rep. of Germany .

OTHER PUBLICATIONS

Wu et al., "Low-Temperature . . . Film", Appl. Phys. Lett., 52(9), 2/88, pp. 754–756.
Roas et al., "Epitarial . . . Process", Appl. Phys. Lett., 52(6), 10/88, pp. 1557–1559.
Koren et al., "Highly Oriented . . . Substrates", Appl. Phys. Lett., 53(23), 12/88, pp. 2330–2332.
Venkatessan et al., "Superconducting . . . Si", Appl. Phys. Lett., 53(3), 7/88, pp. 243–245.
X. D. Wu et al., "Epitaxial . . . Evaporation", Appl. Phys. Lett., vol. 51, No. 11, 9/1987, pp. 861–863.
S. Witanachchi et al., "Deposition . . . Annealing", Appl. Phys. Lett., 53, (3), Jul. 18, 1988, pp. 234–236.
A. Inam et al., "As-Deposited . . . Temperature", Appl. Phys. Lett., vol. 53, No. 10, 9/88, pp. 908–910.
J. Narayem et al., "Formation . . . Method", Appl. Phys. Lett., vol. 51, No. 22, 11/87, pp. 1845–1847.
Hwang et al., "Transmission . . . Deposition", Appl. Phys. Lett., 52(21), 5/88, pp. 1834–1836.
Lathrop et al., "Production . . . Annealing", Appl. Phys. Lett., 51(19), 11/87, pp. 1554–1556.
Sorimachi et al., "Formation . . SrTiO$_3$ Substrate", Jap. Journal of Appl. Phys., vol. 26, No. 9, 9/87, pp. 1451–1452.
Tietz et al., "The Morphology . . . Substrates", Mat. Res. Soc. Symp. Pro., vol. 99, 1988.
H. P. Scholch et al., "Production of YBa$_2$Cu$_3$O$_{7-x}$ Superconducting Thin Films by Pulsed Pseudospark Electron Beam Evaporation", Applied Physics A, vol. A48, No. 4, Apr. 1989, pp. 397 to 400, Berlin, DE.
Ichiro Terasaki et al., "Superconducting Films of YBa$_2$Cu$_3$O$_x$ and Bi-Sr-Ca-Cu-O Fabricated by Electron (List continued on next page.)

Primary Examiner—Nam X. Nguyen
Attorney, Agent, or Firm—Sughrue, Mion, Zinn, Macpeak & Seas

[57] ABSTRACT

A process for producing an epitaxial and/or highly texturized grown film, free of foreign phases, of a high-$T_c$-oxide superconductor on a substrate, in which an ablation process is triggered and maintained on a spender target by means of pulsed particles or a laser beams, and the thus developing small droplets are deposited on a heated substrate. The substrate is held at a temperature at which the droplets on impact wet the substrate and coagulate into a uniform smooth film.

An apparatus for this process comprises an electron source which produces a pulsed electron beam with an electron energy of about 10 to 20 keV and a current density in the range of $10^3$ to $10^4$ A/cm$^2$.

13 Claims, 2 Drawing Sheets

OTHER PUBLICATIONS

Beam Deposition with a Single Source", *Japanese Journal of Applied Physics*, Part 2: Letters, Aug. 27, 1988, No. 8, Tokyo, Japan.

P. M. Mankiewich et al., "Reproducible Temperature Superconductors", *Applied Physics Letters*, vol. 51, No. 21, Nov. 23, 1987, pp. 1753 to 1755.

T. Venkatesan et al., "Observation of Two Distinct Components During Pulsed Laser Deposition of High T Superconducting Films", *Applied Physics Letter*, vol. 52, No. 14, Apr. 4, 1988, New York, U.S.A.

T. Terasaski et al., "Superconducting Films of $YBa_2CuO_x$ and Bi-Sr-Ca-Cu-O Fabricated by Electron-Beam Deposition with a Single Source", *Japanese Journal of Applied Physics*, vol. 27, No. 8, Aug. 1988, pp. 1480 to 1483, Tokyo, Japan.

T. Venkatesan, C. C. Chang, D. Dijkkamp and others, Bell Communication Research, Red Bank, N.J., entitled "Substrate Effects on the Properties of Y-Ba-Cu-O Superconducting Films Prepared by Laser Deposition".

S. Komuro, Y. Aoyagi, T. Morikawa and S. Namba, *Japan Journal of Applied Physics*, vol. 27, No. 1, Jan. 1988, pp. L34-L36, entitled "Preparation of High-$T_c$ Superconducting Films by Q-Switched YAG Laser Sputtering".

PROCESS AND APPARATUS FOR PRODUCING EPITAXIAL AND/OR HIGHLY TEXTURED GROWN FILM, FREE OF FOREIGN PHASES, OF A HIGH-$T_c$-OXIDE SUPERCONDUCTOR ON A SUBSTRATE

BACKGROUND OF THE INVENTION

The present invention concerns a process and apparatus for producing an epitaxial and/or highly textured grown film, free of foreign phases, of a high-$T_c$(critical temperature)-oxide superconductor on a substrate.

An epitaxial and/or highly textured growth of a superconducting film on a substrate occurs when (i) the lattice constant of the substrate plane and the superconducting phase of the material are comparable, (ii) the substrate temperature corresponds to the growth temperature of the superconducting phase, (iii) the growth speed of the film permits an epitaxial orientation, and (iv) stoichiometric deviations are limited.

Remarkable success in the production of high-current carrying films of oxide superconductors can be achieved by the use of UV-EXIMER lasers. In such a process, a laser beam with a precisely adjusted energy density, generates an ablation process on a spender target comprised of a bulk material having a superconducting composition, to almost completely evaporate from the spender target a coating of a few nanometers which is deposited on a receiver target (substrate).

In general, the known oxide superconductor material are extremely unstable in the vapor phase and decay into their individual components. In spite of this, one observes in laser ablation on the receiver target a good to very good stoichiometry. Such a process is known from the publication by T. Venkatesan, C. C. Chang, D. Dijkkamp and others, Bell Communication Research, Red Bank, New Jersey, entitled "Substrate Effects on the Properties of Y-Ba-Cu-O Superconducting Films Prepared by Laser Deposition".

As can be seen from the article by S. Komuro, Y. Aoyagi, T. Morikawa and S. Namba, *Japanese Journal of Applied Physics*, Volume 27, No. 1, January 1988, pages L34 to L36, entitled "Preparation of High-$T_c$ Superconducting Films by Q-Switched YAG Laser Sputtering", film formation on a substrate is said to occur according to a cluster model in which the bulk material of the spender target is subjected to laser irradiation and thereby released from the spender target in the form of clusters (droplets), and these clusters then deposit on the substrate to form a film. As can be seen from the article, the as-deposited film which is formed from the clusters as a result of the droplet of the superconductor material hitting the substrate is insulating and requires a high temperature post-anneal at 900° C. to make the film superconducting. At this temperature there are already very strong reactions between film and substrate, which can be considered disadvantageous because they exclude a large number of interesting substrate materials ($ZrO_2$, Si, Pt, $Al_2O_3$ etc.). For this reason, the ablation process using UV-EXIMER-Lasers is carried out in such a way that the superconducting material evaporates practically completely and the film is produced on the substrate by the precipitation of discrete molecules.

The formation of droplets can be observed particularly frequently when the energy density of the laser beam is adjusted too high or when, instead of the EX-IMER laser, the less expensive long-wave lasers, e.g., $CO_2$ or argon lasers, are used.

The known process has the disadvantage that, due to the precipitation of discrete molecules on the substrate, the build-up of a superconducting film proceeds very slowly.

The formation of a superconducting film of about 300 nm requires a time elapse of about one hour according to the known process.

EXIMER lasers are very costly and thus expensive. Their degree of effectiveness is low. Due to the use of hydrogen fluoride, special safety measures have to be taken. The films produced are often not smooth, but have protrusions which cannot contribute to the current transport.

SUMMARY OF THE INVENTION

It is an object of the present invention to provide a process for producing a high-$T_c$ oxide superconducting on a substrate which does not suffer from the cited disadvantages.

Another object of the present invention is to provide a process for producing a high-$T_c$ oxide superconductor on a substrate which avoids the use of an EXIMER laser.

A further object of the present invention is to provide a process for producing a high-$T_c$ oxide superconducting film on a substrate in which the time requirement for the build-up of the superconductor film is reduced substantially and in which a film having a thickness of up to 10 μm can be formed.

A still further object of the present invention is to provide a process for producing a high $T_c$ oxide superconducting film which is mostly single-phase, i.e., free of foreign phases.

An additional object of the present invention is to provide an apparatus for producing high-$T_c$ oxide superconducting films on a substrate.

Additional objects and advantages of the present invention will be set forth in part in the description which follows and in part will be obvious from the description or can be learned by practice of the invention. The objects and advantages are achieved by means of the processes, instrumentalities and combinations particularly pointed out in the appended claims.

To achieve the foregoing objects and in accordance with its purpose, the present invention provides a process for producing an epitaxial and/or highly textured grown film, free of foreign phases, of a high-$T_c$-oxide superconductor on a substrate, in which a spender target is subjected to pulsed particles or a laser beam to trigger an ablation process to produce small droplets which are desposited onto a heated substrate, comprising: holding the substrate at a temperature at which the droplets wet the substrate on impact and coagulate into a uniform smooth film.

Wetting means that the liquid droplets after impact on the substrate surface spread out completely due to their low surface tension compared to that of the substrate.

Preferably, the substrate temperature is held at a temperature of about 300° to 400° C. below the melting temperature of the high-$T_c$-oxide superconductor. The small droplets preferably have a diameter in the micron range, such as 1 to 5 microns.

For many substrates such as Si it is important to prevent a diffusion of atoms between substrate and superconductor layer. In these cases it is preferable to deposit an intermediate layer, e.g., of $ZrO_2$, $Al_2O_3$ or $SiTiO_3$ on the substrate before forming the superconducting film.

The ablation process can be performed by a pulsed high output laser beam producing droplets, e.g., of $CO_2$ or by argon lasers.

However, it is more advantageous if the ablation process is triggered and maintained by the use of a pulsed electron beam with an energy density of about 10 to 20 keV and a current density in the range of $10^3$ to $10^4$ A/cm$^2$.

DETAILED DESCRIPTION OF THE INVENTION

Figure 1:
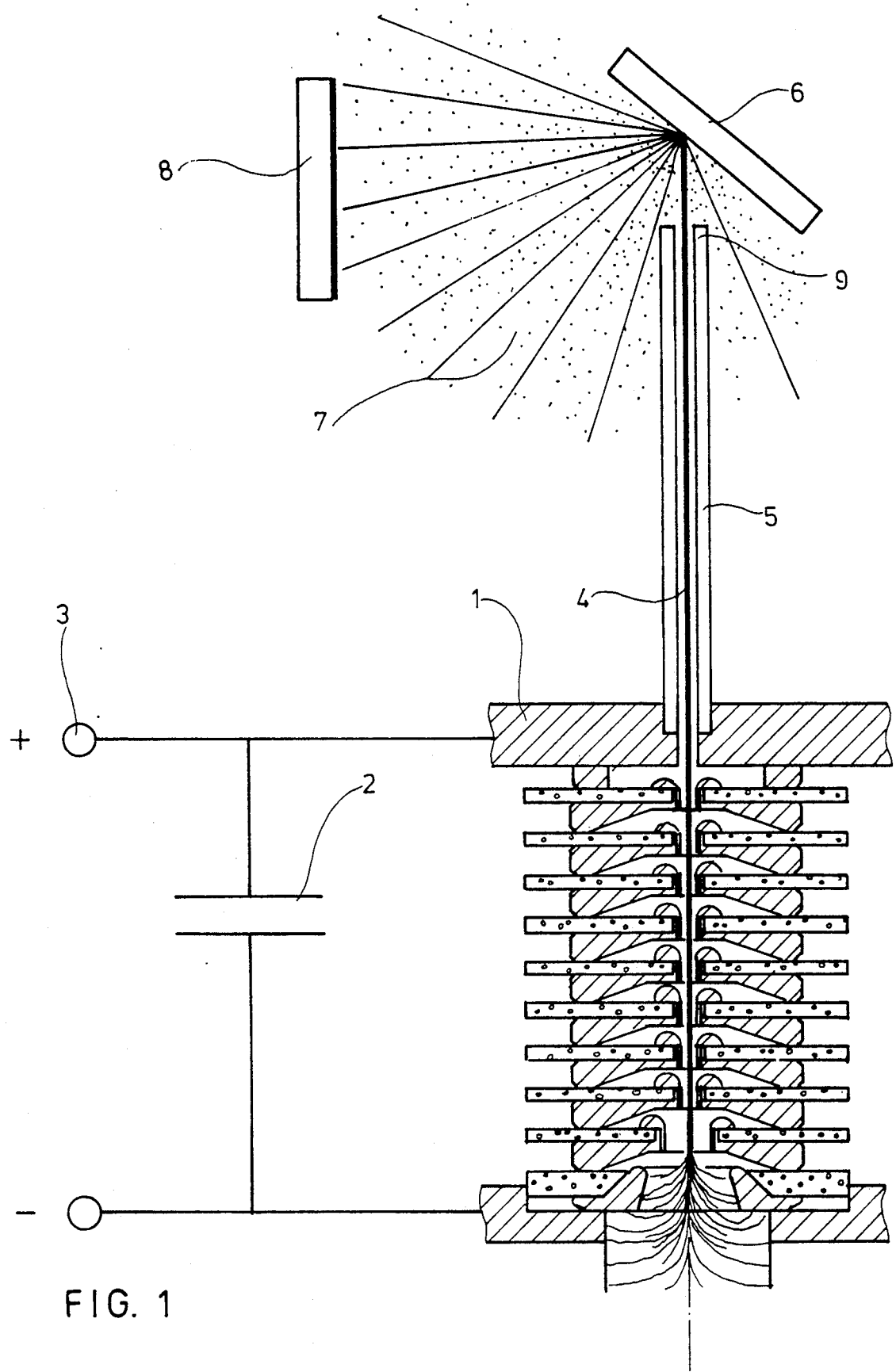
FIG. 1 is a schematic drawing of one embodiment of an apparatus in accordance with the present invention for coating a substrate with a superconducting material according to the method of the present invention.

In the present invention, the droplets produced in the ablation process impact onto the heated substrate with high speed, and spreadout there forming thin film which crystallizes epitaxially. As the overwhelming amount of transferred material is in droplet form, deviations of the chemical composition of the deposited film from the stoichiometry are very slight. Such deviations are in general less than 1%. For this reason, the films produced are particularly free of foreign phases.

With pulsed electron beams the interaction mechanism of the beam with the spender target material essentially depends on the mass density of the spender target material. The advantage of the electron beam is its well defined penetration capability into the target material. With an electron energy of 10 to 20 keV, there is a penetration range in oxide superconductors in the magnitude of micrometers, such as 1 to 5 micrometers. If current densities in the range of $10^3$ to $10^4$ A/cm$^2$ are selected, the impacted area on the spender target decays in an explosive manner into a phase mixture of liquid droplets and vapor.

As the electron source, it is possible to use a high-performance modification of a psuedo-spark chamber, which modification is described in DE-PS No. 28 04 393 which is hereby incorporated by reference. With it, with an electric efficiency degree of about 20%, a self-focusing electron beam with a pulse length of about 50 ns is produced. Compared to this, the efficiency degree of EXIMER lasers is more than 20 times less.

In the present invention, films of a thickness range between 1 and 10,000 nm can be produced.

For most applications, the build-up of a superconductor film between 100 nm and 300 nm thickness is preferred. The build-up of a film of 300 nm thickness only requires a time span in the range of about 5 minutes.

The electron beam emanating from the electron source preferably is lead or directed into an insulating sleeve which is connected with one of its ends to the electron source. The other end of the insulating sleeve is a free end which preferably is positioned near the spender target. With such a sleeve the danger of contamination of the electron source by liquid droplets is practically excluded. The distance between the free end of the sleeve and the spender target may be between a few centimeters (e.g. 1 to 3) and a few millimeters (e.g. 1 to 3).

The inside diameter of the sleeve preferably should be in the same size range as the diameter of the electron beam. It is advantageous if the inside diameter of the sleeve is about twice the size of the diameter of the electron beam. For example, the inside diameter of the sleeve can be up to 4 mm, preferably 1 to 2 mm, and the diameter of the electron beam can be 0.5 to 1 mm.

It is even possible to guide the electron beam in a bent sleeve with a radius down to 2 cm whereby a deflection angle of the electron beam up to 90 degrees achieved. The length of the sleeve can be up to one meter. This opens up the possibility to simultaneously aim electron beams of many, parallel arranged psuedo-spark chambers onto a spender target, and thus effect a large surface film coating on the substrate. In this case the substrate can be pulled continuously past the spender target. There is also the possibility to pull a wire-shaped substrate axially through the spender target.

In order to minimize the wear and tear of the spender target and to assure a uniform deposit, the spender target can preferably be rotated around its axis. The present invention is further explained below with reference to the drawings which illustrate two embodiments of the present invention.

Referring to FIG. 1, there is shown an apparatus for coating a substrate with a superconductor material according to the present invention.

In this case $YBa_2Cu_3O_7$ was employed as superconductor material and formed into a spender target. The substrate (receiver target) was made of zirconium oxide stabilized with yttrium (10% Y). During the coating, the substrate was held at a temperature of 820° C.

As operating gas, oxygen with a partial pressure of 10 Pa was used.

Other possible superconductor material are $Bi_2Sr_2Ca_2Cu_3O_8$ or $Ti_2Ba_2Ca_2Cu_3O_8$.

A high performance modification of a psuedo-spark chamber was used as an electron source 1. External wiring of electron source 1 comprised an electrical capacitor 2 and a high voltage supply 3. Electron source 1 produces an electron beam 4 which is directed into a ceramic sleeve tube 5 with a diameter of 1 to 2 mm and a length of 10 cm. Beam 4 can be transported in ceramic sleeve 5 from electron source 1 to the other end of sleeve 5 almost without loss, due to an electrostatic focussing effect. There, beam 4 hits a spender target 6 and triggers, through an ablation process, a droplet fog 7, which grows on a receiver target 8. Possible oxygen losses on the surface of the droplets are partially compensated by oxygen operating gas.

A part of droplet fog 7 also gets into the free end of ceramic sleeve 5 which is near spender target 6 and precipitates in the free end an undesirable contamination 9. This contamination is evaporated by the subsequent pulsed electron beam and, for the most part, blown out again in the direction of spender target 6. In this manner the service life of the psuedo-spark chamber is not impaired by contamination through ablation vapors. With 5 joule per pulse of primary electrical energy it is possible to attain 400,000 pulses without a change in the operating manner of the pseudo-spark chamber.

Figure 2:
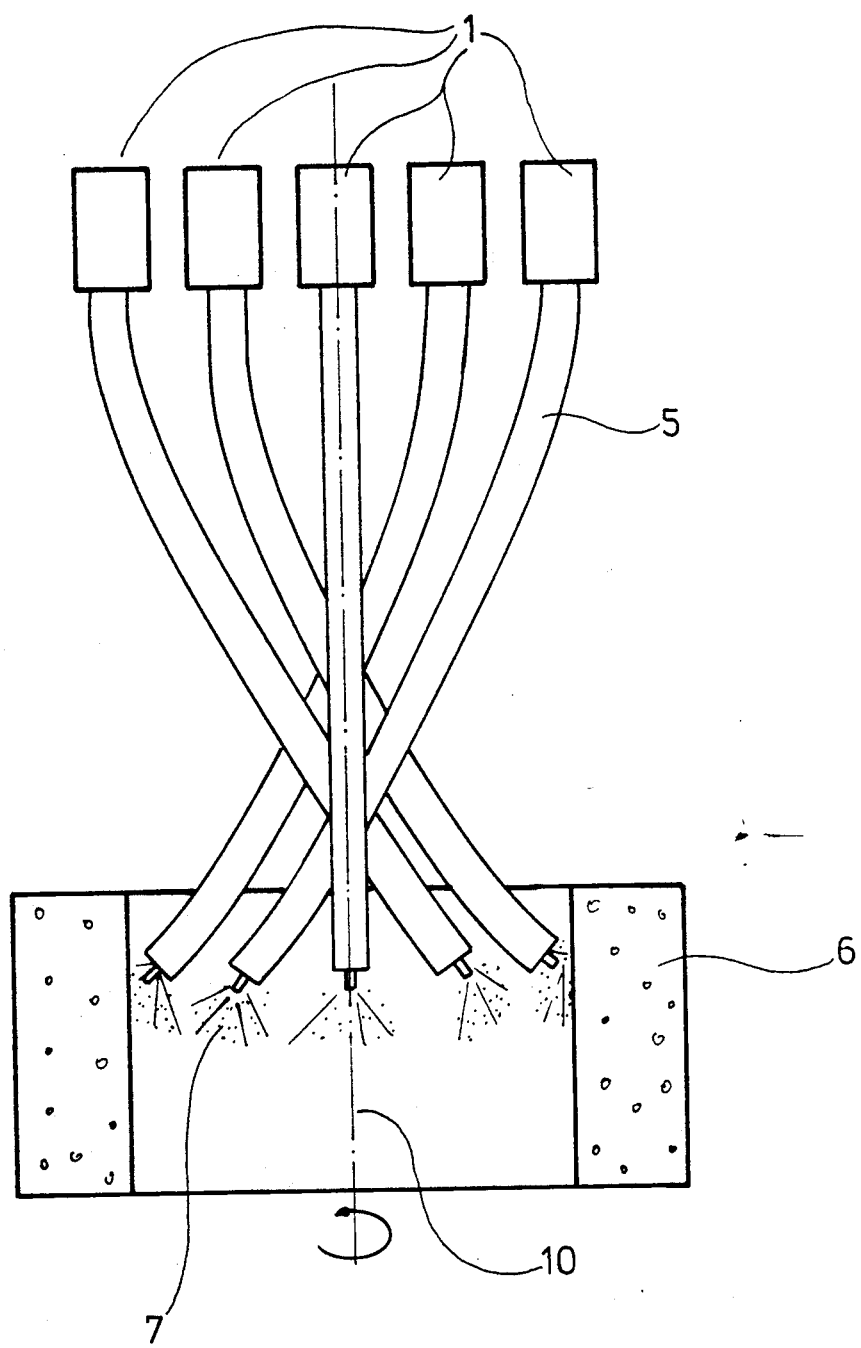
FIG. 2 is a schematic drawings of a second embodiment of an apparatus in accordance with the present invention for coating a substrate with a superconductor material according to the method of the present invention.

FIG. 2 shows an arrangement in which a substrate, e.g., a wire, can be continuously provided with a superconducting film.

Several electron sources 1, each being a high-performance modification of the pseudo-spark chamber, are arranged in parallel. The electron beams from these electron sources 1 are led with the help of bent quartz-glass sleeves 5, one for each electron source, to a cylinder or ring-shaped spender target 6. During the ablation process, spender target 6 is rotated around its axis 10 in order to attain a uniform erosion of the spender target. Due to the ring shape of the spender target, the droplet fog 7, which forms during the ablation process, is concentrated in a space within and outside the spender target. A wire is continuously passed through this space in the rotation axis 10. The cylinder arrangement has the advantage that droplets which do not get onto the substrate for the most part precipitate again on the cylinder walls of the spender target and are available for a further ablation process. Thus, the spender target is optimally used.

It will be understood that the above description of the present invention is susceptible to various modications, changes and adaptions, and the same are intended to be comprehended within the meaning and range of equivalents of the appended claims.

What is claimed is:

1. Process for producing an epitaxial and/or a highly textured grown film, free of foreign phases, of a high-$T_c$-oxide superconductor on a substrate, in which a spender target made of superconductor material is subjected to a pulsed electron beam to generate an ablation process to produce small droplets which are deposited onto a heated substrate, comprising: adjusting the energy of the pulsed electron beam to an energy which forms droplets of the spender target and holding the substrate at a temperature at which the droplets wet the substrate on impact and coagulate into a uniform, smooth, epitaxial and superconducting film.

2. Process according to claim 1, wherein the substrate temperature is held to a temperature about 300° to 400° C. below the melting temperature of the high-$T_c$-oxide superconductor.

3. Process according to claim 1, and further comprising producing an oxidation resistant intermediate coating on the substrate before forming the high-$T_c$-oxide superconductor film.

4. Process according to claim 3, wherein, the intermediate coating is comprised of $ZrO_2$, $Al_2O_3$ or $SiTiO_3$.

5. Process according to claim 1, wherein the ablation process is generated and maintained by subjecting the spender target to a pulsed electron beam with an electron energy of about 10 to 20 keV and a current density of about $10^3$ to about $10^4$ A/cm$^2$.

6. Apparatus for producing an epitaxial and/or a highly textured grown film, free of foreign phases, of a high $T_c$-oxide superconductor on a substrate in which a spender target made of a superconductor is subjected to an energy source to produce small droplets of the spender target, which droplets are deposited onto a heated substrate, the improvement wherein the energy source is an electron source for producing a pulsed electron beam with an electron energy of about 10 to 20 Kev and a current density of $10^3$ to $10^4$ A/cm$^2$.

7. Apparatus according to claim 6, and further comprising an insulating sleeve, which has one end connected to the electron source and which has a free end positioned near the spender target.

8. Apparatus according to claim 7, wherein the distance of the free end of the sleeve from the spender target is 1 to 5 centimeters.

9. Apparatus according to claim 7, wherein the inside diameter of the sleeve is in the same size magnitude as the diameter of the electron beam.

10. Apparatus according to claim 7, wherein the sleeve is a straight tube of a length of 0.5 cm up to 100 cm.

11. Apparatus according to claim 7, wherein the sleeve is bent with a radius down to 2 cm whereby a deflection angle of the electron beam up to 90 degrees is achieved.

12. Apparatus according to claim 7, wherein the spender target is a ring shaped spender target,. and the apparatus comprises several parallel arranged electron sources, with each electron source having an insulating sleeve connected to it, with each sleeve having a bent shape and pointing with its free end to the ring-shaped spender target which can be rotated around its axis.

13. Apparatus according to claim 12, wherein a wire-shaped substrate is led by or through the ring-shaped spender target.

* * * * *